(12) United States Patent  (10) Patent No.: US 7,183,864 B1
Gutnik  (45) Date of Patent: Feb. 27, 2007

(54) RING OSCILLATOR FOR USE IN PARALLEL SAMPLING OF HIGH SPEED DATA

(75) Inventor: Vadim Gutnik, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 773 days.

(21) Appl. No.: 10/303,422

(22) Filed: Nov. 25, 2002

Related U.S. Application Data (60) Provisional application No. 60/396,500, filed on Jul. 17, 2002.

(51) Int. Cl.
*H03B 27/00* (2006.01)

(52) U.S. Cl. .................... 331/57; 331/177 R; 331/34; 331/74; 375/376; 327/156; 327/158; 327/159

(58) Field of Classification Search ................ 331/57, 331/16, 34, 177 R, 74; 375/376; 327/156, 327/158, 159
See application file for complete search history.

(56) References Cited

U.S. PATENT DOCUMENTS 6,411,669 B1    6/2002  Kim
6,650,190 B2 * 11/2003  Jordan et al. ................. 331/57
6,901,126 B1 *  5/2005  Gu ............................. 375/355

OTHER PUBLICATIONS

Gray, C. Thomas, et al., "A Sampling Technique and Its CMOS Implementation with 1 Gb/s Bandwidth and 25 ps Resolution," IEEE Journal of Solid-State Circuits, vol. 29, No. 3, Mar. 1994, pp. 340-349.

* cited by examiner

*Primary Examiner*—Arnold Kinkead
(74) *Attorney, Agent, or Firm*—Zagorin O'Brien Graham LLP (57) ABSTRACT

A ring oscillator has multiple stages that are independently adjustable. The delay is controlled using digital signals supplied to the stages. Each stage may receive two digital signals to control the delay with outputs of the particular stage controlling which of the two digital signals is used to control the delay through the stage at any particular time. The stages of the ring oscillator may be biased towards either supplying a faster or slower output signal. Each stage of the ring oscillator includes a tail node having a gate of a first transistor coupled to a digital control signal that adjusts a delay of the ring oscillator stage by turning on or off the transistor and a second transistor having a gate input coupled to a first or second voltage. A first plurality of the ring oscillator stages have the second transistor tied to the first voltage causing the second transistor to be on and a second plurality of the oscillator stages being tied to the second voltage causing the second transistor to be off, thus biasing the stage towards either being faster or slower, respectively.

27 Claims, 8 Drawing Sheets

| DATA, PHASE, DATA | DECODE |
|---|---|
| 0  0  0 | IGNORE |
| 0  0  1 | EARLY |
| 0  1  0 | IGNORE |
| 0  1  1 | LATE |
| 1  0  0 | LATE |
| 1  0  1 | IGNORE |
| 1  1  0 | EARLY |
| 1  1  1 | IGNORE |

|       | 0 | 1 | 2 | 3 | 4 | 5 | 6 | 7 |
|-------|---|---|---|---|---|---|---|---|
| DELAY | 1 | 1 | 1 | 1 | 1 | 1 | 1 | 1 |
| FIXED | 1 | 0 | 1 | 0 | 1 | 0 | 1 | 0 |
| DELAY | 0 | 0 | 0 | 0 | 0 | 0 | 0 | 0 |
| FIXED | 1 | 0 | 1 | 0 | 1 | 0 | 1 | 0 |
| DELAY | 0 | 1 | 0 | 1 | 0 | 1 | 0 | 1 |
| FIXED | 1 | 0 | 1 | 0 | 1 | 0 | 1 | 0 |

RING OSCILLATOR FOR USE IN PARALLEL SAMPLING OF HIGH SPEED DATA

CROSS-REFERENCE TO RELATED APPLICATION

This application claims the benefit of provisional Application No. 60/396,500, filed Jul. 17, 2002, which application is incorporated herein by reference in its entirety.

FIELD OF THE INVENTION

This invention relates to receivers for high-speed serial communication systems and more particularly to aspects of clock and data recovery circuits used therein.

DESCRIPTION OF THE RELATED ART

Communication systems frequently transmit data in which the clock is embedded in the data stream rather than sent as a separate signal. When the data stream is received, a clock and data recovery circuit recovers the embedded clock and retimes the received data to the recovered clock. Traditionally, a phase-locked loop (PLL) has been used to perform the clock recovery operation. A typical phase locked loop configured for clock and data recovery operations includes a phase detector that samples the input data signal using a clock supplied by a voltage controlled oscillator (VCO). In one embodiment of a bang—bang phase detector, the phase detector determines whether the input data signal is being sampled early or late and supplies information to adjust the VCO accordingly.

In general, controlling the oscillator phase in order to accurately recover clock and data is an important aspect of successful clock and data recovery circuits. It would be desirable to provide improvements and greater flexibility in controlling the oscillator.

SUMMARY

Accordingly, in one embodiment, the invention provides separate controls for each stage of a ring oscillator. By providing separate controls, each stage can be more coarsely tuned than if all stages received the same control voltage to adjust stage delay, but still provide adequate overall granularity in terms of phase adjustment for the oscillator.

In one embodiment an integrated circuit is provided that includes a ring oscillator including multiple stages. Each of the multiple stages has a stage delay that is adjustable independently of other of the multiple stages. The delay may be controlled using digital signals supplied to the stages. Each stage may receive two digital signals to control the delay with one or more outputs of the particular stage controlling which of the two digital signals is used to control the delay.

In one embodiment, the stages of the ring oscillator are biased towards either supplying a faster or slower output signal. In one embodiment, each stage of the ring oscillator includes a tail node having a gate of a first transistor coupled to a digital control signal that adjusts a delay of the ring oscillator stage by turning on or off the transistor and a second transistor having a gate input coupled to a fixed voltage, a first plurality of the ring oscillator stages having the second transistor tied to a first voltage causing the second transistor to be on and a second plurality of the oscillator stages being tied to a second voltage causing the second transistor to be off, thus biasing the stage towards either being faster or slower.

In another embodiment a method is provided that controls delay through ring oscillator stages independently to adjust a phase or frequency of one or more clocks generated by the ring oscillator. That independent control may be accomplished by supplying digital control signals to the ring oscillator stages to adjust the delay. The method may further include selecting one of at least two digital control signals to adjust delay through an oscillator stage according to one or more outputs of the oscillator stage.

The method may further include biasing each stage to be a fast stage or a slow stage by supplying a fixed voltage to a gate of a second transistor in the tail node of the ring oscillator stage, the stage being biased towards being one of a fast stage and a slow stage according to a value of the fixed voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
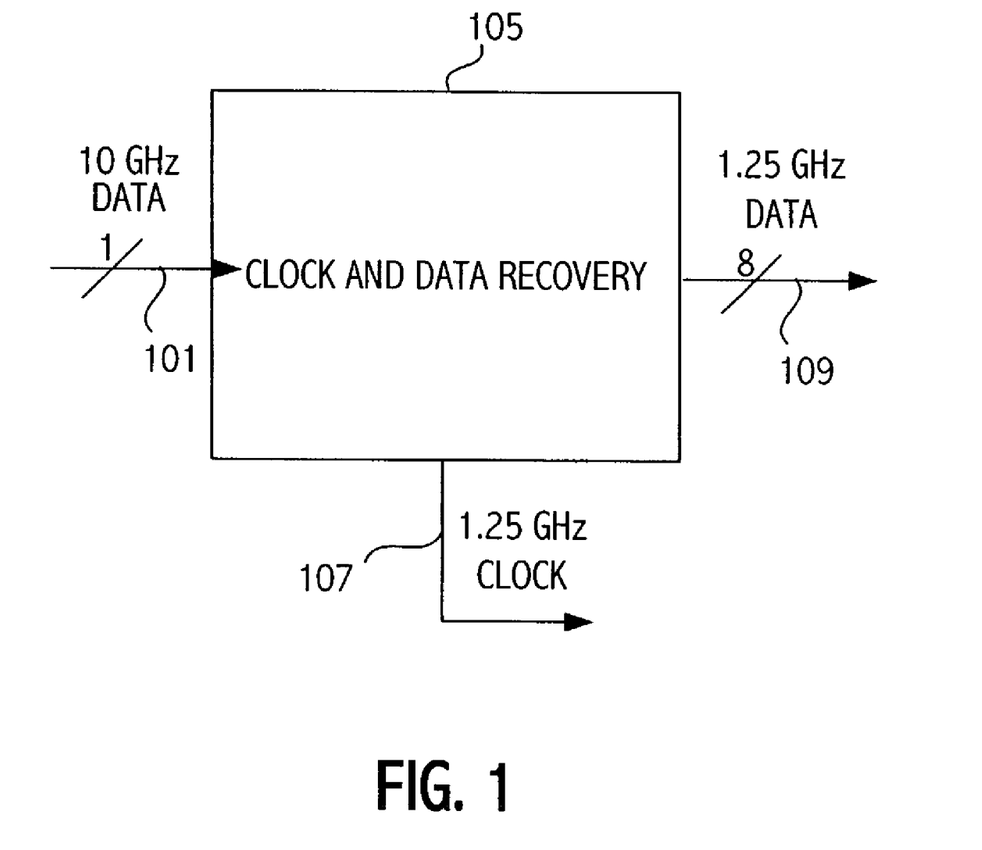
FIG. 1 illustrates a block diagram of a portion of a receiver.

Referring to FIG. 1, a block diagram illustrates operation of a clock and data recovery circuit suitable for use in a high-speed serial communications system compliant with standards such as Synchronous Optical Network (SONET) or Synchronous Digital Hierarchy (SDH) (the European counterpart to SONET). In an exemplary embodiment, 10 GHz serial data is received on node 101 into clock and data recovery circuit 105. The clock and data recovery circuit supplies 8 bit wide data at 1.25 GHz on node 109 and a 1.25 GHz clock on node 107. The data rate of the received data and the speed of the recovered clock and speed and width of the recovered data will vary according to system needs.

Figure 2:
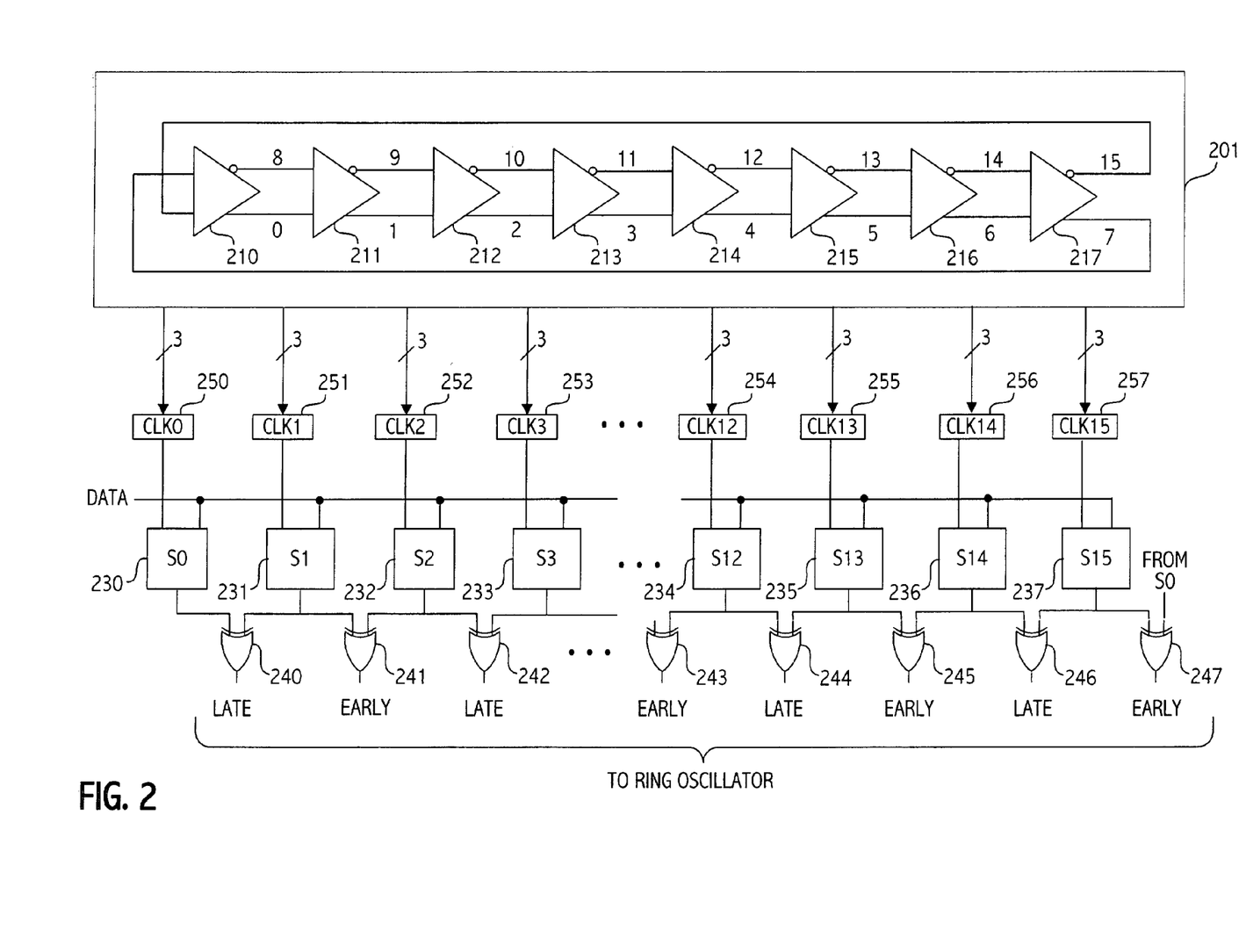
FIG. 2 illustrates a voltage controlled oscillator (VCO) and sampling circuits utilized as part of a clock and data recovery function.

Referring to FIG. 2, within clock and data recovery circuit 105 is a voltage controlled oscillator (VCO) 201, which is implemented in the illustrated embodiment as a differential ring oscillator having eight stages. The ring oscillator may have other number of stages according to the needs of the particular system. As illustrated in more detail later, the ring oscillator receives control signals to adjust the phase of the differential clocks supplied by the ring oscillator.

The goal of a clock and data recovery circuit is to sample each bit in the center of the "data eye", which is defined by the location of possible bit transitions. In other words, the ideal place to sample data is equidistant between zero crossing of the data. A bang—bang phase detector system samples the input data stream at twice the data rate with uniformly timed samples, and adjusts the phase of the sampling instants so that a predetermined half of the sampling instants (e.g., the odd samples) are aligned with the zero-crossings. That causes the other half of the samples (the even samples) to be aligned in the optimal part of the data eye.

The exemplary clock and data recovery circuit further includes sixteen data samplers, 230–237 (S0–S15, only eight of which are shown), which are configured to sample the data received from the limiting amplifier using clocks generated based on outputs of the ring oscillator 201 as described further herein. The outputs of the sampling circuits are logically combined by the XOR gates 240–247 (only eight of sixteen shown) to provide signals indicating whether the clock being used to sample the input data is "early" or "late".

Figure 3:
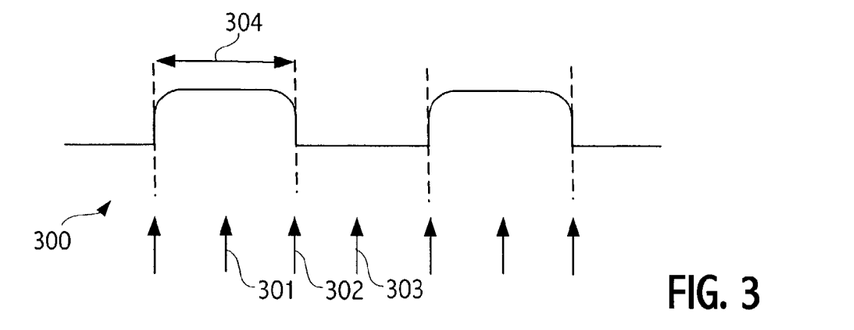
FIG. 3 illustrates concepts relating to data sampling.

FIG. 3 illustrates the concept of "early" or "late" sampling of data utilized in traditional bang—bang phase detectors. Assume a received signal 300 is received in the receiver circuit and supplied to the phase detector illustrated in FIG. 2. That signal is sampled at twice the data rate at sample times 301, 302, and 303. In FIG. 3, a bit period is indicated at 304. As can be seen each bit period is sampled twice with one of the samples occurring at potential transitions. Samples 301 and 303 are data samples occurring in the middle of the bit period and sample 302 is a phase sample occurring at a transition.

Figure 4:
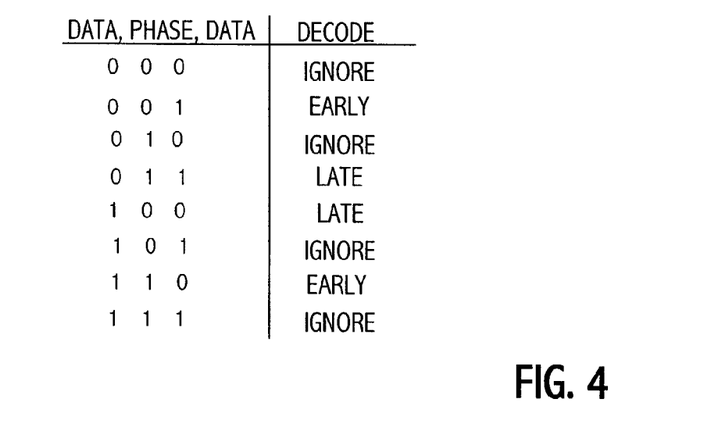
FIG. 4 illustrates how sampling data is interpreted for the purposes of phase adjustment.

FIG. 4 shows the information that may be determined from the sample values returned at 301, 302, and 303. If the sample values are 000 or 111, there is no information that is available as to whether the sampling is occurring early or late. If the last two samples differ, i.e., 001 or 110, that indicates that the sampling is occurring too early (before the transition). If the first two samples differ, (011 or 100) that indicates that the sampling is too late (after the transition). The values of 010 and 101 are ignored. Note that the phase sample provides information as to whether the sampler is sampling late if it differs from the previous data sample, and the data sample provides information as to whether the sampling is early if it differs from the previous phase sample.

Turning back to FIG. 2, XOR gates 240–247 generate the early and late indications. Those signals are in turn supplied back to VCO 201 to adjust the phase of the VCO to be earlier or later.

Figure 5:
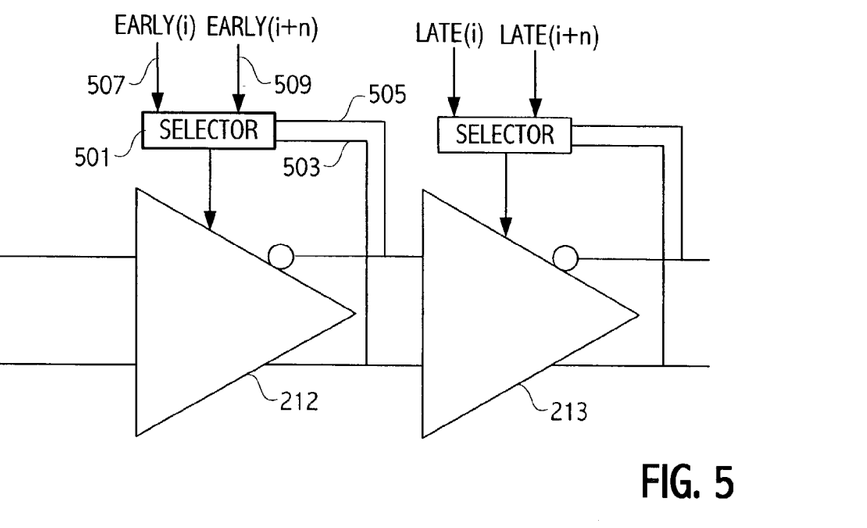
FIG. 5 illustrates in greater detail how delay control signals are supplied to stages of the ring oscillator.

Referring now to FIG. 5, the manner in which the "early/late" signals are supplied to VCO 201 to adjust the phase of the clocks generated by the VCO are shown for one embodiment in more detail. Exemplary VCO stages 212 and 213 are illustrated. For each stage, the two supplied signals, both either "early" or "late", are utilized to control the delay through the stage, thus controlling the phase of the oscillator. In the embodiment illustrated in FIG. 2, there are eight "early" signals and eight "late" signals generated by logic gates 240–247. Each of the eight stages 210–217 receive two of those sixteen signals. In one embodiment, a selector circuit 501 supplies one of the two early signals to control delay through the stage 212 at any particular time. The selector circuit 501 uses the output clocks 503 and 505 of the particular stage to control which of the two delay control signals 507 and 509 is being utilized to adjust the delay at any particular time. Note that while the selector circuit 501 is shown as outside VCO stage 212 for ease of understanding, the selector circuit may in fact be incorporated into each VCO stage. The selector circuit 510 for stage 213 is configured in a similar manner.

Note that the delay signals being supplied are being supplied digitally. It is desirable to avoid having the digital value of those delay signals changing while the output of the oscillator stage whose delay is being affected changes. Thus, the "early" or "late" signals coupled to a particular stage should be stable well before the transition of a clock signal generated by the particular oscillator stage and should remain stable through the changing edge. Note that the changing edge is typically very short compared to the duration of the oscillator period. Simulation can be used in order to find the appropriate delay control signals for each stage that are stable before the clock edge of interest generated by the particular stage. Note also that the early/late signals are only meaningful at the edges of the clock signal in a particular stage. Without a selector circuit described above, the timing margin is half the period of the VCO. However, with the selector circuit, each individual early/late signal has a timing margin of the entire period of the VCO.

In one embodiment, which can utilize the circuits illustrated in FIG. 2, the data rate on the input signal is approximately 10 Gbits per second, which provides one data bit per 100 picoseconds (ps). Each data bit and each possible transition is sampled. In order to sample at a lower frequency than 20 GHz, a configuration illustrated in FIG. 2 may be utilized, which utilizes 16 samplers 230–237 having sample clocks offset by 50 ps. The ring oscillator 201 operates at 1.25 GHz and thus each sample clock has a period lasting for 800 Ps.

Figure 6:
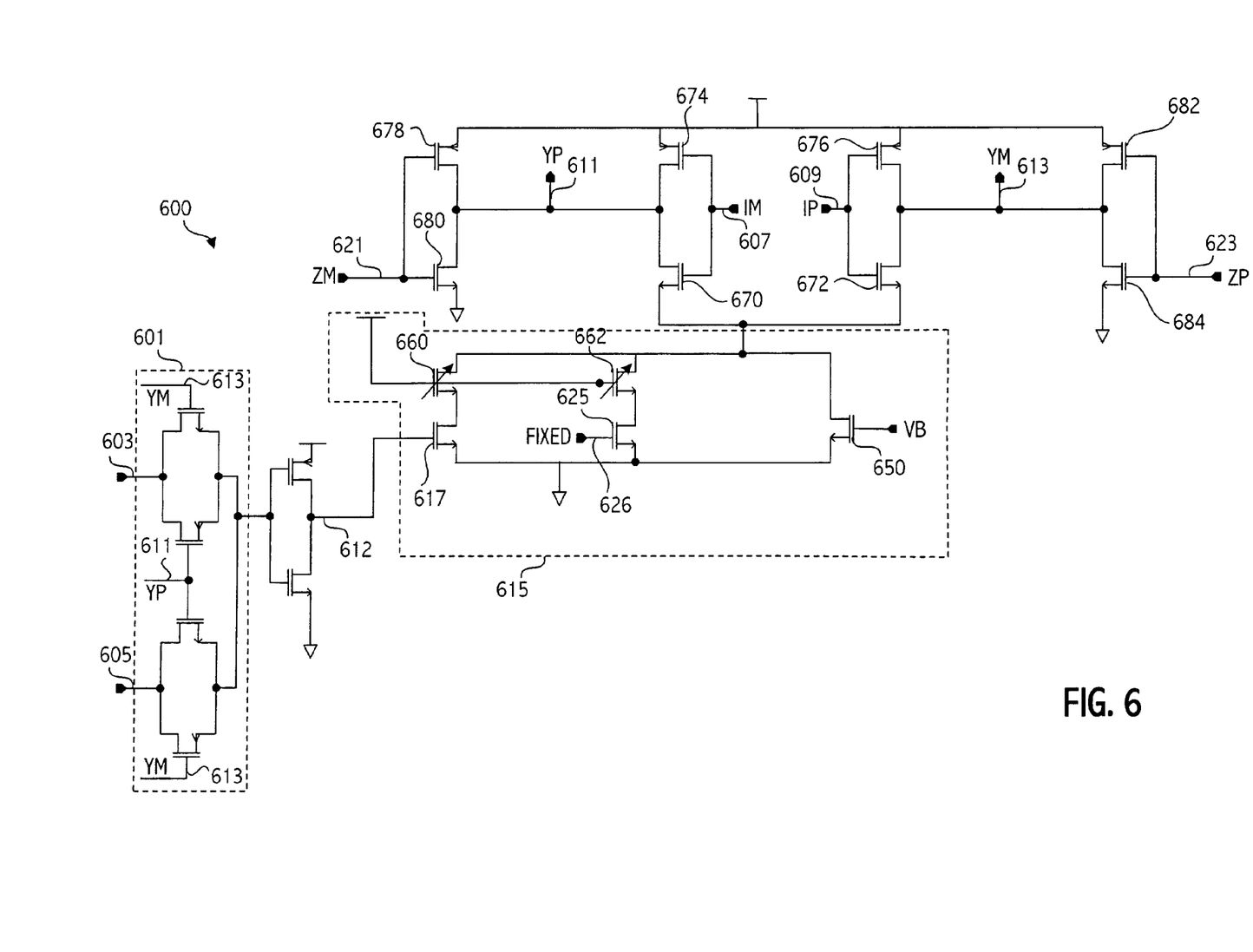
FIG. 6 illustrates an exemplary ring oscillator stage.

Referring to FIG. 6, an oscillator stage 600 is shown in greater detail. In the particular embodiment illustrated, a selector circuit 601 receives two delay control signals 603 and 605. The oscillator stage is differential and thus receives two input signals from the previous oscillator stage 607 and 609. The "IM" label associated with input 607 designates a minus input while the "IP" associated with input 609 designates a plus input. The oscillator supplies two differential outputs 611 (YP) and 613 (YM) with "YP" designating a plus output and "YM" designating a minus output. The two differential outputs 611 and 613 select which of the two delay inputs 603 and 605 are selected as the input to control the current through the tail node 615, thus affecting the delay through the oscillator stage. If the delay input is such as to cause the transistor 617 to be turned on, the delay through the stage will be reduced, thus causing the oscillator to "speed up" as compared to transistor 617 being turned off by the delay input. In an embodiment, the transition of the clock generated by the oscillator is the critical edge effecting the sampling circuit. In fact, a logical AND of the clock phases generates the SAMPLE edge of the sampler. In an embodiment, the falling edge of the clock creates the falling edge of the SAMPLE pulse, described further below, and that determines at what instant the sampling circuit stops following the data. The delay control inputs ("late" or "early") are selected so as not to change around that critical transition. As can be seen from the FIG. 6, when the output on node 613 is positive, selector circuit 601 selects the delay control input on node 603 and when the output on node 611 is positive, the delay control input on node 605 is supplied as the delay control signal to tail node 615 of oscillator stage 600.

The inputs ZM and ZP (where M represents minus and P plus) on nodes 621 and 623 respectively, are both driven to ground during normal operation and provide a small current to keep the tail node 615 from discharging to ground. That in turn provides just enough common-mode feedback to each stage avoid common-mode instability.

In addition the inputs ZM and ZP are used to initialize the oscillator to a desired state. An even length oscillator such as the one illustrated in FIG. 2, has two long-term stable states. One stable state is a static mode, with a large common mode component. Another stable state is a differential oscillation with very little common mode difference between the stages. In order to avoid the static operating state on startup, the following procedure may be used to force the oscillator into a differential oscillation mode. First ZP is driver high for all of the stages. That puts the ring oscillator into a known state far away from the static operating condition. Then ZP is driven low for all stages and the oscillator quickly converges to the desired differential oscillation mode. In one embodiment, digital logic is used to detect if the VCO is stopped and if the logic detects the stop state, it causes ZP to pulse, thereby starting the VCO. Such a start is typically needed only on power-up.

In order to tune each stage individually, and to provide some common-mode stabilizing feedback, the tail node 615 for each stage needs to be isolated from the other stages and from ground. The gate of transistor 650 is coupled to a voltage input VB and acts to provide a small amount of impedance between the tail node and ground, without generating too much voltage for the current drop from the delay stage. If there were not enough impedance or it was just shorted out, there would be no means left to tune each stage independently, and the common-mode voltage of the oscillator would drift until the oscillator stopped functioning. If there were too much voltage drop, the oscillator stage might not run fast enough.

Note that the "early" outputs from the logic gate, when asserted, should cause the drive transistor 617 to be off, causing the transitions in the oscillator stage to occur more slowly and the "late" outputs from the logic gates 330–337, indicating that the sample circuit sample late, should cause the drive transistor 617 to be on, thereby causing the transitions in the oscillator stage to occur more quickly.

There are several types of bang—bang phase detectors. In one type of bang—bang phase detector, only two pieces of information are provided, speed up or slow down. In another type of bang—bang phase detector, three states are provided, speed up, slow down, or do nothing. A third state can be achieved in the embodiment illustrated in FIG. 2 using another drive transistor with its gate tied to a fixed value. The fixed value varies between oscillator stages to either turn on or turn off the transistor.

Referring again to FIG. 6, in an embodiment, the tail node 615 includes a second drive transistor 625 having a "fixed" input 626 that biases the oscillator stage towards either slowing down the oscillator or speeding up the oscillator as explained more fully below. Since all of the oscillator stages are individually controlled, whether the oscillator as a whole speeds up or slows down is determined by the cumulative actions of the individual stages. Assume that the delay control signals provide a "1" when the ring oscillator should go faster (corresponding to a "late" signal) and a "0" if the ring oscillator should go slower (corresponding to an "early" signal). If half of the oscillator stages have the fixed input fixed at "0" and half of the oscillator stages have the fixed input to the gate of transistor 625 fixed at "1", those with the fixed input at "0" are biased towards going slower and those with the fixed input at "1" are biased at going faster. For those with the fixed input at '0', the two possible states for the inputs to the gates of transistors 617 and 625 are '00' and '01'. For those stages having the fixed input set to '1', the two possible states for the inputs to the gates of transistors 617 and 625 are '10' and '11'.

Note that the sizes of transistors 660 and 662 may be varied by including additional transistors using metal mask techniques well known in the art. Usually, the transistor 650 will be much larger than transistors 617 and 625, because the bang—bang input should have a relatively small impact on the delay. Transistors 670 and 672 will generally be comparable to transistors 674 and 676. In one embodiment, transistors 678 and 682 are about ⅓ the strength of 674 and 676, but that could vary greatly in different embodiments. If transistors 678 and 678, are relatively larger, the oscillator stage runs faster but has relatively slower edges.

Figure 7:
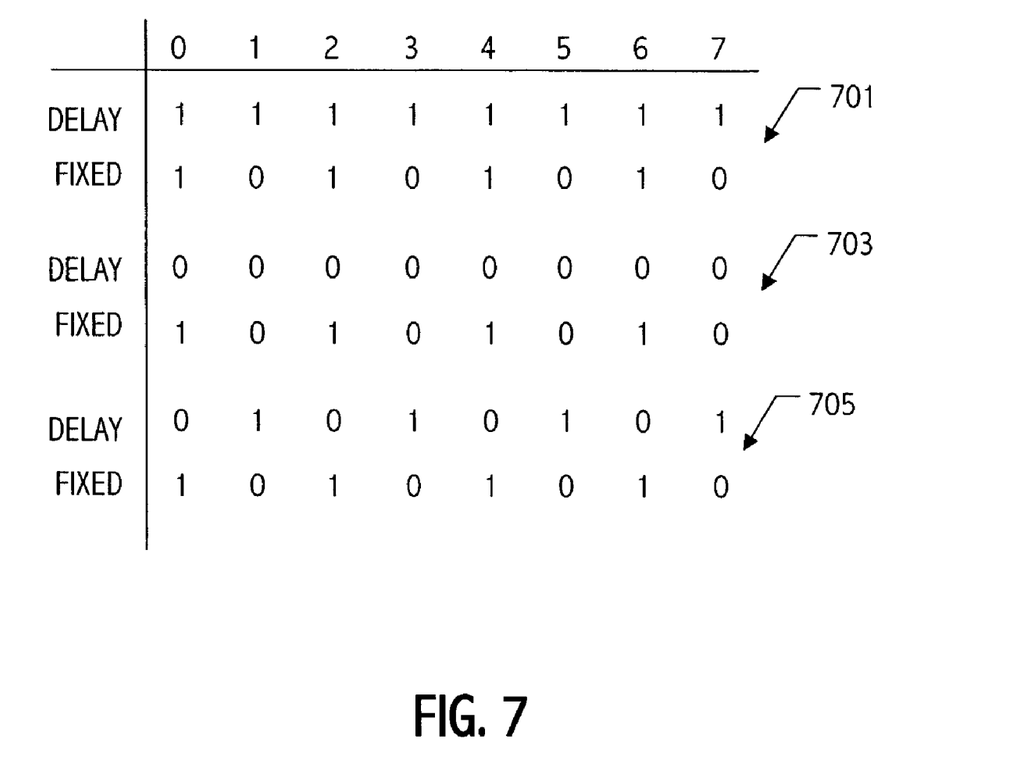
FIG. 7 illustrates various possible scenarios to explain the use of a fixed drive transistor in the tail node of a ring amplifier stage.

FIG. 7 illustrates several possible exemplary states that an eight state ring oscillator may enter. The delay values for stages 0–7 are shown along with fixed inputs for each for three different scenarios 701, 703 and 705. Assume that a '1' in FIG. 7 is a value indicating that the ring oscillator stage should speed up while the '0' is a value that the ring oscillator stage should slow down. That corresponds to turning on or off, respectively, the transistors 617 and 625 shown in FIG. 6. As shown at 701, all eight stages have a delay input of '1' causing the drive transistor 617 to be on. The fixed transistors in the stages alternate between '1' and '0'. That means that half of the stages operate at '10' and half at '11'. Those stages operating at '10' are "balanced" as compared to those stages operating at '11' or '00' and thus those stages operating at '11' operate faster. Cumulatively, the ring oscillator operates faster since four stages are set to run faster and four stages are set to a balanced position.

In the second scenario at 703, all eight stages have a delay input causing the drive transistor 617 to be off. If the fixed input alternates between '0' and '1' for the stages, half the stages operate with the transistor gate inputs set to '00' and half to '01'. Those stages operating at '01' are balanced and those stages operating at '00' slow down. Cumulatively, the ring oscillator operates more slowly since four stages are set to run slower and four stages are set to a balanced position.

Note that the cases shown at 701 and 703 are examples with data at the extremes, and with more typical data, fewer than four stages may be tuned away from the balance point. Having fewer than four stages tuned away from the balance point still causes the VCO to speed up or slow down (depending on the direction of tuning).

Referring to the third scenario shown in FIG. 7, a balanced ring oscillator is shown with all the stages operating at '10' or '01'. In one embodiment implemented using stages such as the stages shown in FIG. 6, half the stages have the fixed input set to turn off the transistor 625, thus biasing the stage towards being slower (operating either slow '00' or balanced '10') and half the stages have the fixed input set to turn on the transistor 625, thus biasing the stage towards being faster (operating either '11' or neutral '01'). Thus, a third balanced state ('10' or '01'), in addition to a faster and a slower state, is achieved by the ring oscillator using a fixed transistor as illustrated in FIG. 6.

Use of the fixed transistor accounts for a small amount of skew that may be present because of the tendency of the ring oscillator to move towards its stable oscillating state. Because the stages are tuned individually, there will be some small instantaneous variation delay, and hence the clocks will not be perfectly aligned. However, that variation is negligibly small, at least in certain embodiments. Note that in some embodiments, the fixed transistor is not used.

Figure 8A:
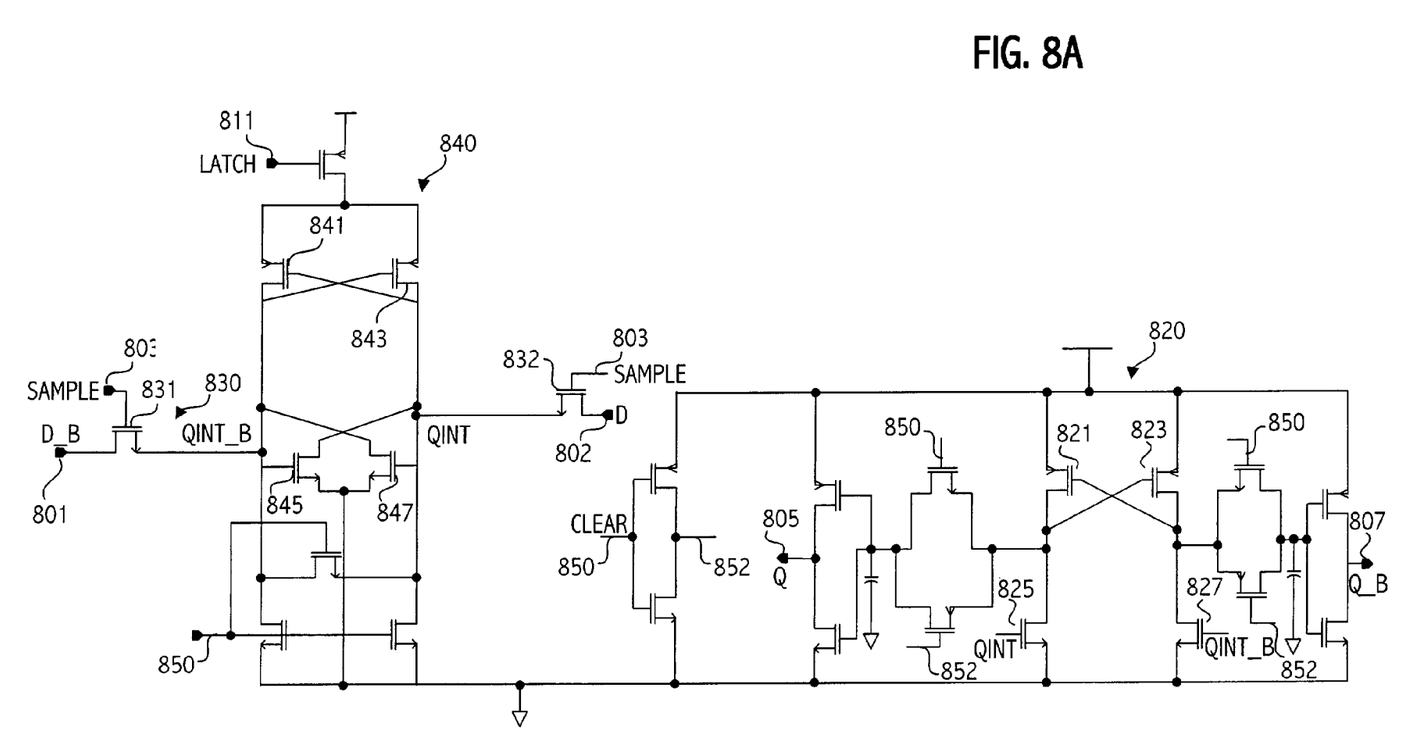
FIG. 8A illustrates an exemplary sampler circuit.

An exemplary sampler circuit 230 is shown in more detail in FIG. 8A. The sampling circuit receives data on node 801 and supplies its sampled data (q and q_b) on nodes on 805 and 807. The sampling circuit receives three "clocking" signals, a "clear" signal on node 809 to reset the sampler to a balanced state, a "sample" signal on node 803, to sample and hold the signal into the sampler, and a latch signal on node 811. The clear signal also causes the value held by the latch at 820 formed by transistors 821, 823, 825 and 827 to be transferred to the output nodes 805 and 807. When clear is inactive, the output nodes are isolated from the latch 820. Note that appropriate sizes of the transistors in the sampling circuit are determined by trading off such factors as bandwidth, noise, loading on preceding stages, and charge injection. In the illustrated embodiment, the sizes of transistors 841 and 843 and 831 and 832 are important considerations and all the transistors were roughly the same size as transistors 831 and 832, approximately 2–8 microns in width, while transistors 841 and 843 were much larger, approximately 48 microns in width. Note that in one embodiment the size of the "clear transistors" should be minimized to minimize uncalibrated charge injection. Additional transistors, not shown, may be used to calibrate the voltage offset in the sampling circuit.

Figure 8B:
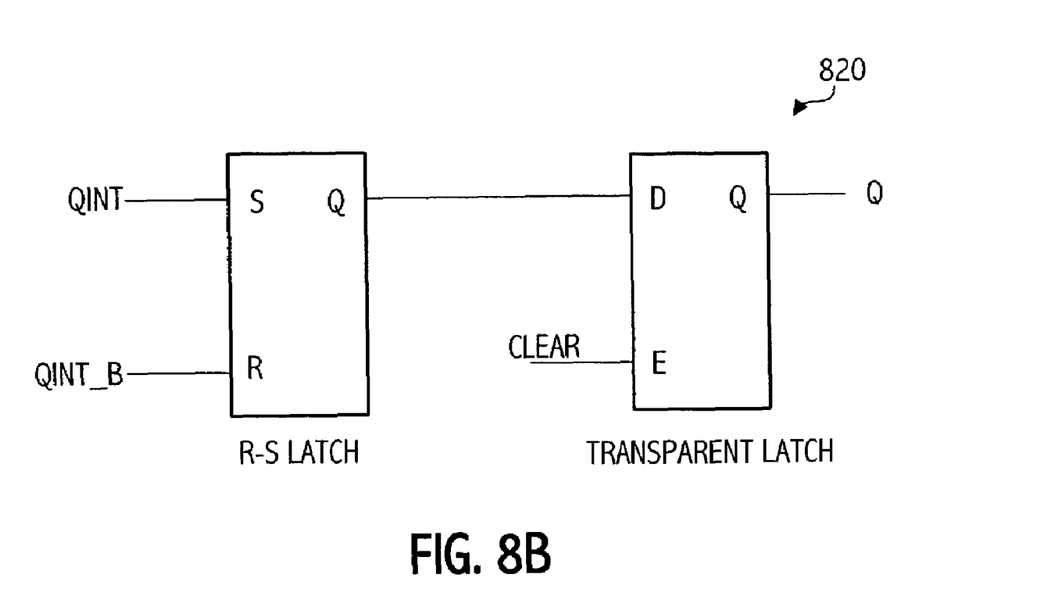
FIGS. 8B and 8C illustrate operation of a portion of the sampler circuit shown in FIG. 8A.
Figure 8C:
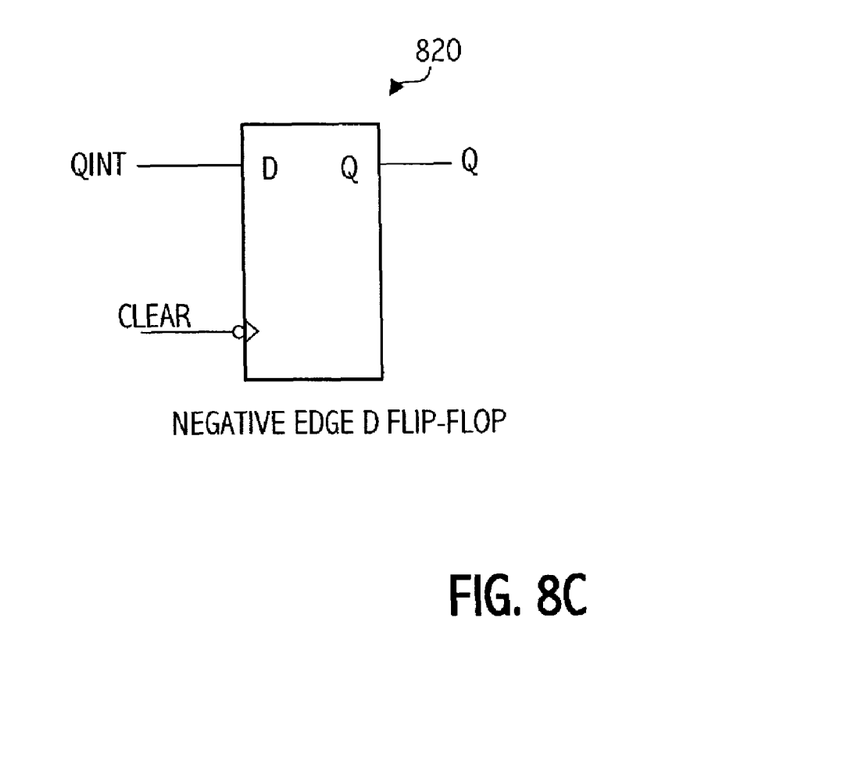

The latch 820 is shown in FIG. 8B to more readily understand the operation of the circuit. The latch 820 functions as an R-S latch followed by a clocked latch. That is functionally the same as the representation in FIG. 8C, which shows a flip-flop timed off the falling edge of clear.

The sampler circuit also includes sample and hold circuits 830 formed respectively by transistors 831 and 832 and capacitance on nodes QINT and QINT_B, which sample the data on nodes 801 and 803, respectively, when the sample pulse 803 is active. The sample pulse immediately follows the clear pulse. An active low latch pulse on node 811 causes the latch 840, formed by transistors 841, 843, 845 and 847, to latch the signal provided by sample and hold circuit 830. That also results in latch 820 receiving the sampled data.

Referring again to FIG. 2, in one embodiment, each sample circuit is supplied by a pulse shaper circuit 250–257, respectively. The pulse shaper circuit supplies the clock signals described above required by sampler circuits 230–237, an embodiment of which is illustrated in FIG. 8. The pulse shaper circuits 250–257 each receive three clocks from oscillator 201. Each pulse shaper circuit gets clocks with the same relative phase to each other, but delayed by 50 ps from the preceding pulse shaper. So if one pulse shaper circuit gets clocks 0, 3, and 5, the adjacent pulse shaper circuit gets clock 1, 4, and 6. The pulse shaper includes three independent blocks, each of which functions as a dynamic AND gate, which ANDs two of the received clock signals together to make a shorter pulse, which is supplied to the corresponding sampler circuit.

Figure 9:
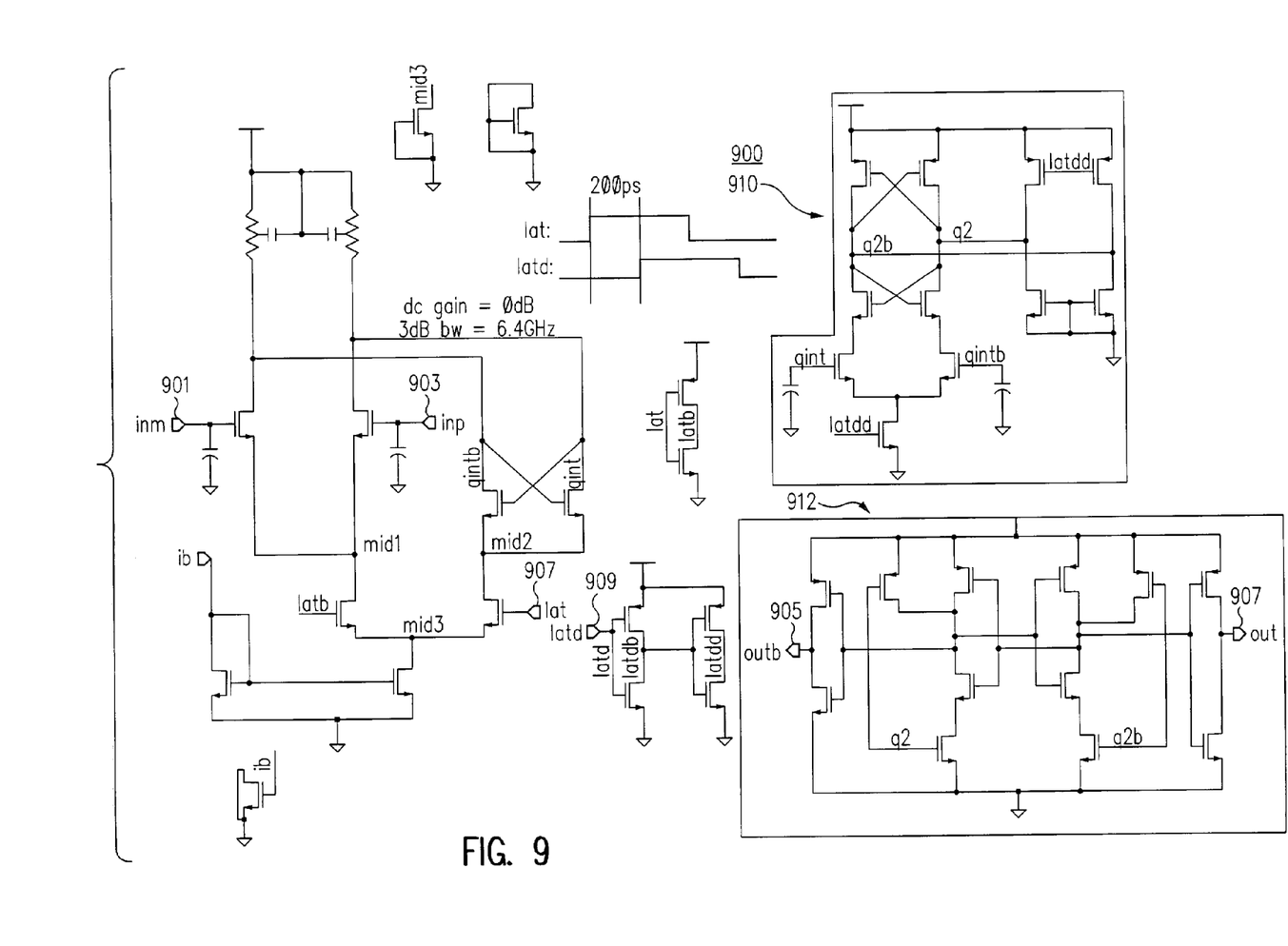
FIG. 9 illustrates another exemplary sampler circuit.

In other embodiments of the invention, the sample circuit is implemented as a conventional current mode logic (CML) sampler circuit and the pulse shaper circuit is not used. FIG. 9 illustrates an exemplary CML sample circuit 900, which receives differential data (inm) and (inp) on nodes 901 and 903 respectively. The CML sample circuit 900 supplies differential data (out and outb) on nodes 905 and 907. A latch pulse (lat) is supplied on node 907 and a delayed latch pulse (latd) is supplied on node 909. The block 910 in FIG. 9 functions as a transparent latch and block 912, which follows block 910, functions as an R-S latch. The ib input provides a bias input for the sample circuit 900.

Thus, a ring oscillator having the capability to individually control the delay through each stage has been described The description of the invention set forth herein is illustrative, and is not intended to limit the scope of the invention as set forth in the following claims. For instance, while in some embodiments, all the stages may be separately controlled, in other embodiments, a group of two or more stages may be controlled by one set of delay control signals and other groups may be controlled by other sets of delay control signals. Further, while some logic has been shown as single ended and some as differential, differential logic may be utilized instead of single-ended and single-ended logic may be used instead of differential logic. Other variations and modifications of the embodiments disclosed herein, may be made based on the description set forth herein, without departing from the scope and spirit of the invention as set forth in the following claims.

What is claimed is:

1. An integrated circuit comprising:
   a ring oscillator including multiple stages;
   a plurality of sampling circuits coupled to the ring oscillator and coupled to sample a data signal received by the integrated circuit, respective outputs of the sampling circuits being logically combined to form digital signals utilized to control, at least in part, delay through the multiple stages of the ring oscillator; and
   wherein each of the multiple stages has a stage delay that is adjustable independently of others of the multiple stages.

2. The integrated circuit as recited in claim 1 wherein respective stages are coupled to respectively receive at least one of the digital signals to adjust a delay of the respective stage according to a value of the at least one digital signal.

3. The integrated circuit as recited in claim 2 wherein the stages receive respective first and second digital signals, the delay through respective stages being determined at any particular time according to a value of at least one of the first and second digital signals.

4. The integrated circuit as recited in claim 3 wherein the first digital signal controls delay during a first part of a period of the stage and the second digital signal controls delay during another part of the period of the stage.

5. The integrated circuit as recited in claim 3 wherein one digital signal is utilized according to a value of a first output signal of a respective stage and the second digital signal is utilized according to a value of a second output signal of the respective stage.

6. The integrated circuit as recited in claim 3 wherein each stage further includes a selector circuit coupled to receive the first and second digital signals, the selector circuit selecting one of the first and second digital signals to control the delay of each respective stage.

7. The integrated circuit as recited in claim 6 wherein the selector circuit selects one of the first and second digital signals according to one or more outputs generated by the respective stage.

8. The integrated circuit as recited in claim 3 wherein the first and second digital signals, indicate that signals used in sampling received data are one of early and late.

9. The integrated circuit as recited in claim 1 wherein each of the digital signals indicates that the data signal is being sampled one of early or late in the sampling circuits.

10. The integrated circuit as recited in claim 1 wherein each of the stages of the ring oscillator is biased towards either supplying a faster or slower output signal, a first plurality of the stages being biased towards supplying the faster output signal and a second plurality of the stages being biased towards supplying the slower output signal.

11. The integrated circuit as recited in claim 1 wherein, at least one stage of the ring oscillator includes a tail node having a gate of a first transistor coupled to one of the digital signals that adjusts a delay of the ring oscillator stage by turning on or off the transistor; and
wherein the tail node of the at least one stage includes a second transistor having a gate input coupled to a fixed voltage to cause the at least one stage to be biased towards being one of faster and slower.

12. The integrated circuit as recited in claim 1 wherein each stage of the ring oscillator includes a tail node having a gate of a first transistor coupled to one of the digital signals that adjusts a delay of the ring oscillator stage by turning on or off the transistor and a second transistor having a gate input coupled to one of a first and second voltage, a first plurality of the ring oscillator stages having the second transistor tied to the first voltage causing the second transistor to be on and a second plurality of the oscillator stages being tied to the second voltage causing the second transistor to be off.

13. The integrated circuit as recited in claim 12 wherein the first and second voltages are fixed.

14. A method comprising:
receiving a data signal;
sampling the data signal in a plurality of sampling circuits using sampling signals generated based on outputs of a ring oscillator;
logically combining respective outputs of the sampling circuits to form digital control signals for controlling respective delays through stages of the ring oscillator; and
controlling delay through the ring oscillator stages independently using respective digital control signals to adjust a phase or frequency of one or more output signals generated by the ring oscillator.

15. The method as recited in claim 14 further comprising supplying respective digital control signals to each of the ring oscillator stages to adjust the delay through each ring oscillator stage independently of other ring oscillator stages according to the respective digital control signals, thereby adjusting the phase of the one or more output signals.

16. A method comprising:
controlling delay through ring oscillator stages independently to adjust a phase or frequency of one or more output signals generated by the ring oscillator; and
selecting one of at least two digital control signals to adjust delay through one of the ring oscillator stages according to one or more outputs of the one ring oscillator stage.

17. The method as recited in claim 14 wherein the digital control signals indicate to the oscillator stage to do one of increasing the delay and reducing the delay of the oscillator stage, thereby adjusting the phase of the one or more output signals of the ring oscillator.

18. The method as recited in claim 14 wherein a plurality of the digital control signals indicate that the data signal is being sampled early and a plurality of the digital control signals indicate that the data is being sampled late.

19. The method as recited in claim 14 further comprising biasing each of the ring oscillator stages to be biased towards supplying one of a faster and a slower output signal, a first plurality of the ring oscillator stages being biased towards supplying the faster output signal and a second plurality of the stages being biased towards supplying the slower output signal.

20. The method as recited in claim 14 further comprising adjusting a delay of a ring oscillator stage by turning on or off a first transistor in a tail node of the ring oscillator stage, using one of the digital control signals coupled to a gate the first transistor.

21. The method as recited in claim 20 further comprising selecting the digital control signal supplied to the gate from at least two digital control signals supplied to the ring oscillator stage, the two digital control signals indicating one of early or late.

22. The method as recited in claim 20 further comprising biasing each stage to be a fast stage or a slow stage by supplying a fixed voltage to a gate of a second transistor in the tail node of the ring oscillator stage, the stage being biased towards one of a fast stage and a slow stage according to a value of the fixed voltage.

23. The method as recited in claim 22 further comprising biasing a first plurality of stages to be slow stages and a second plurality of the stages to be fast stages.

24. An apparatus comprising:
a ring oscillator including means for adjusting a delay of each ring oscillator stage independently;
a plurality of sampling circuits coupled to the ring oscillator for sampling high speed data; and
a plurality of logical circuits for logically combining outputs of the sampling circuits to form digital signals utilized to control, at least in part, respective delays through stages of the ring oscillator.

25. The apparatus as recited in claim 24 further comprising means for biasing a ring oscillator stage to being one of a fast stage or a slow stage.

26. The integrated circuit as recited in claim 2 wherein a first plurality of the digital signals indicate to speed up and a second plurality of the digital signals indicate to slow down.

27. The method as recited in claim 16 wherein the at least two digital signals both indicate one of sampling early and sampling late.

* * * * *

UNITED STATES PATENT AND TRADEMARK OFFICE
CERTIFICATE OF CORRECTION

PATENT NO. : 7,183,864 B1 Page 1 of 1
APPLICATION NO. : 10/303422
DATED : February 27, 2007
INVENTOR(S) : Vadim Gutnik It is certified that error appears in the above-identified patent and that said Letters Patent is hereby corrected as shown below:

Col. 10, line 15, please replace "gate the" with --gate of the--

Signed and Sealed this

First Day of May, 2007

JON W. DUDAS
*Director of the United States Patent and Trademark Office*